United States Patent
Kusakabe

Patent Number: 5,583,503
Date of Patent: Dec. 10, 1996

[54] ANALOG/DIGITAL CONVERTER

[75] Inventor: Mitsuo Kusakabe, Itami, Japan

[73] Assignee: Mitsubishi Denki Kabushiki Kaisha, Tokyo, Japan

[21] Appl. No.: 317,492

[22] Filed: Oct. 4, 1994

[30] Foreign Application Priority Data

Oct. 6, 1993 [JP] Japan .................................. 5-250431

[51] Int. Cl.$^6$ ..................................................... H03M 1/38
[52] U.S. Cl. ....................................................... 341/161
[58] Field of Search ........................... 341/161, 155, 341/158, 159, 165, 160, 162; 307/362, 359, 491, 494

[56] References Cited

U.S. PATENT DOCUMENTS 5,061,926  10/1991  Washiyama .
5,262,686  11/1993  Kurosawa ........................ 307/362

FOREIGN PATENT DOCUMENTS 3125250  5/1982  Germany .
63-224526  9/1988  Japan .
1-5226  1/1989  Japan .
1-53630  3/1989  Japan .

*Primary Examiner*—Brian K. Young
*Attorney, Agent, or Firm*—Lowe, Price, LeBlanc & Becker

[57] ABSTRACT

An analog/digital converter which has two comparators and, when the first comparator is successively given an analog voltage and a reference voltage and is comparing the two values, the second comparator is given the analog voltage or the reference voltage and is put in setup state, while when the second comparator is comparing the voltages, the first comparator is put in setup state, so that the comparison operation and the setup operation of the comparators are carried out in parallel, thereby increasing the rate of supplying the results of comparison.

4 Claims, 12 Drawing Sheets

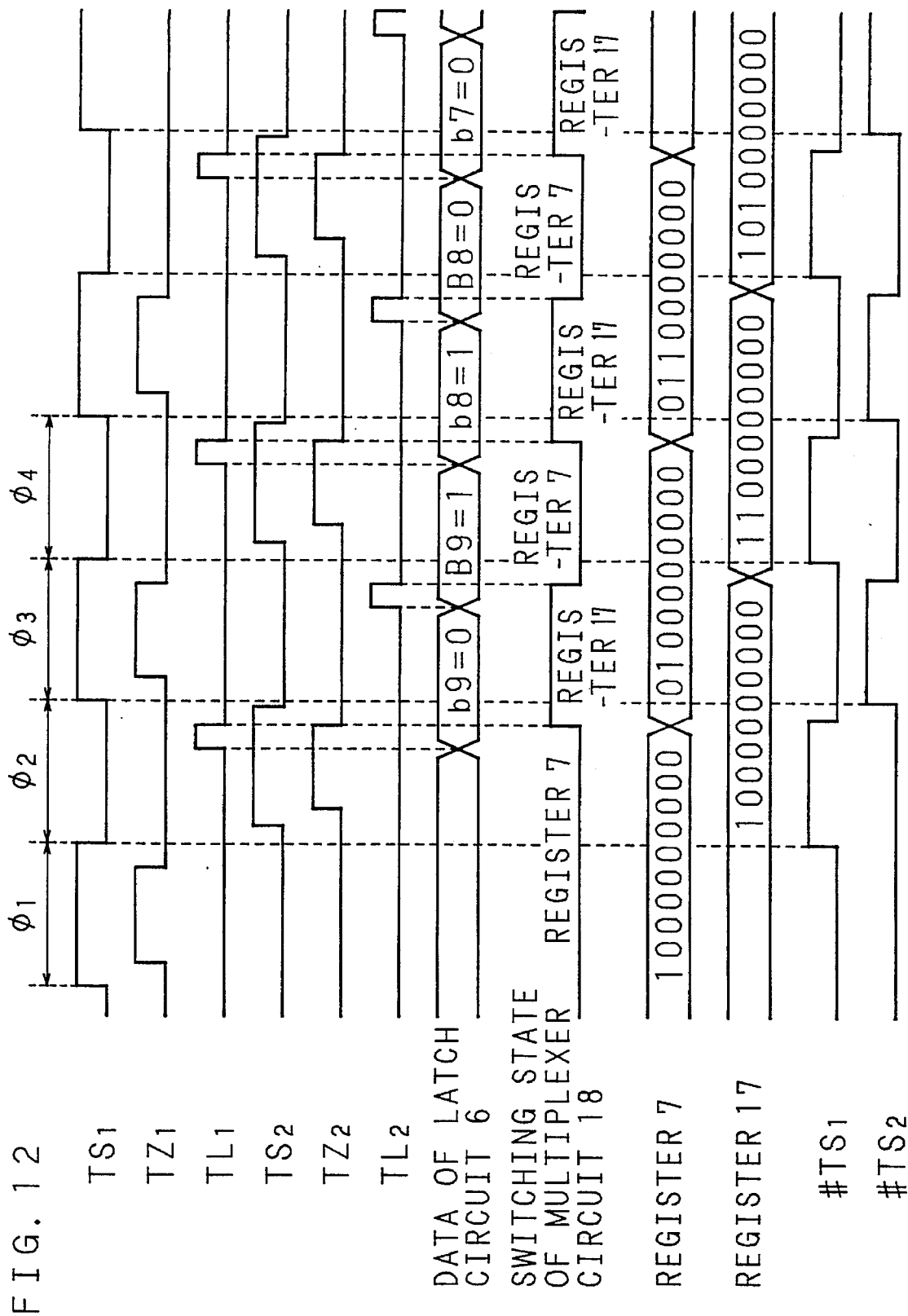

ANALOG/DIGITAL CONVERTER

BACKGROUND OF THE INVENTION

1. Field of the invention

The present invention relates to an analog/digital converter, more particularly to an analog/digital converter capable of converting analog voltages to digital values with a high accuracy at a high speed.

2. Description of Related Art

FIG. 1 is a schematic diagram illustrative of an analog/digital converter of the prior art. Analog voltages $A_{IN0}$ through $A_{INi}$ to be converted to digital values are input to an input control circuit 100. Analog voltages output from the input control circuit 100 are input to a switching circuit 101. A reference voltage output from a selector circuit 9 which selects the reference voltage generated by a ladder resistor 10 is input to the switching circuit 101.

The analog voltage and the reference voltage which are output from the switching circuit 101 are input to a comparator 4, while the comparison output signal from the comparator 4 is input to a latch circuit. 103. Latched data of the latch circuit 103 is input to a sequential comparison register 7, while data stored in the sequential comparison register 7 is input to a decoder circuit 8. Decoded signal output from the decoder circuit 8 is sent to the selector circuit 9. A control circuit 108 is also provided to generate a timing signal for the control of various circuits.

FIG. 2 is a block diagram illustrative of the constitution of the analog/digital converter shown in FIG. 1. The switching circuit 101 has transmission gates 2, 3. An analog voltage $A_{IN}$ which is input to an external analog input terminal 1 is sent to the comparator 4 via the transmission gate 2. The reference voltage $V_{REF}$ is output from the selector circuit 9 which selects the reference voltage generated by the ladder resistor 10 and is input to the comparator 4 via the transmission gate 3. The comparison output signal from the comparator 4 is input to the latch circuit 6 via a transmission gate 5.

The latch circuit 103 has the transmission gate 5 and the latch circuit 6. Data latched in the latch circuit 6 is input to the sequential comparison register 7, while data stored therein is input to the decoder circuit 8. Decoded signal output from the decoder circuit 8 is sent to the selector circuit 9. The transmission gates 2, 3 receive switching signals TS, #TS at the gates thereof. The comparator 4 receives a comparison control signal TZ. The transmission gate 5 receives a latch signal TL at the gate thereof. The input control circuit 100 and the control circuit 108 are not shown in the drawing.

FIG. 3 is a block diagram illustrative of the constitution of the comparator 4. The comparator 4 comprises a capacitor 30, an inverter 31, a capacitor 33, an inverter 34, a serial circuit of an inverter 36 and an inverter 37 of negative logic for the input, a transmission gate 32 connected in parallel with the inverter 31 and a transmission gate 35 connected in parallel with the inverter 34.

The capacitor 30, the inverter 31 and the transmission gate 32 constitute a chopper amplifier, while the capacitor 33, the inverter 34 and the transmission gate 35 constitute another chopper amplifier. The transmission gates 32, 35 receive the comparison control signal TZ at the gates thereof.

FIG. 4 is a block diagram illustrative of the constitution of the latch circuit 6. The latch circuit 6 comprises a serial circuit of an inverter 38 connected to the transmission gate 5 and an inverter 39 of negative logic for the input, a transmission gate 40 connected in parallel with the serial circuit of the inverters 38 and 39, and a NOR circuit 41 with the output thereof being connected to the gate of the transmission gate 40. The NOR circuit 41 receives latch signals TL, TL at the input terminals thereof.

Now the operation of the chopper amplifier will be described below with reference to FIG. 5 which shows the input-output characteristic of the inverter. In case the inverters 31, 34 are constituted from CMOS gates, input-output characteristic of the inverters 31, 34 becomes as shown by solid line in FIG. 5. When the comparison control signal TZ turns to H level so that the transmission gate 32 conducts, one of the chopper amplifiers is biased to point A.

When potential difference $\Delta V$ of the input voltage $V_{IN}$ of the capacitor 30 changes to a positive value ($\Delta V>0$) after the comparison control signal TZ turns to L level under the biased condition as described above so that the transmission gate 32 does not conduct, output voltage $V_{OUT}$ of the chopper amplifier shifts from point A to point B. When potential difference $\Delta V$ of the input voltage $V_{IN}$ changes to a negative value ($\Delta V<0$), output voltage $V_{OUT}$ of the chopper amplifier shifts from point A to point C. In such a sequence, the chopper amplifier compares the magnitudes of two input voltages $V_{IN}$.

Now the operation of the analog/digital converter will be described below with reference to FIG. 6 which shows the timing charts of signals. When the switching signal TS turns to H level during a period $\phi_1$, the transmission gate 2 conducts so that the analog voltage $A_{IN}$ which is inputted to the external analog input terminal 1 is sent to the comparator 4. When the comparison control signal TZ turns to H level, the transmission gates 32, 35 conduct so that the chopper amplifier of the comparator 4 is put in setup state, namely in such a state as the point of operation is biased to the point A shown in FIG. 5.

Then when the switching signal TS turns to L level during a period $\phi_2$, the transmission gate 2 is put in non-conducting state. Also the switching signal #TS turns to H level so that the transmission gate 3 conducts and the reference voltage $V_{REF}$ is input to the comparator 4. Output of the comparator 4 is determined as follows depending on the value of the deviation of the input voltage $\Delta V = A_{IN} - V_{REF}$ of the comparator 4.

$$A_{IN} > V_{REF}: \text{Output of comparator} = \text{"1"} \tag{1}$$

$$A_{IN} < V_{REF}: \text{Output of comparator} = \text{"0"} \tag{2}$$

The reference voltage $V_{REF}$ is a voltage divided into a plurality of parts by the ladder resistor 10. One reference voltage $V_{REF}$ is selected by the selector circuit 9 according to the decoded signal from the decoder circuit 8 and is output. The decoder circuit 8 decodes the data stored in the sequential comparison register 7.

In case the sequential comparison register 7 is made to have 10-bit capacity, the most significant bit $b_9$ is automatically set to "1" before the start of analog to digital conversion, so that it becomes $(b_9, b_8, b_7, b_6, b_5, b_4, b_3, b_2, b_1, b_0) = (1, 0, 0, 0, 0, 0, 0, 0, 0, 0)$.

In the case of $A_{IN} < V_{REF}$, output of the comparator 4 becomes "0", the latch circuit 6 latches a value "0" at the time of $t_1$ by the latch signal TL. This operation of comparison determines the value of the most significant bit $b_9$.

Then at the time $t_2$ during a period $\phi_3$, value "0" is set at bit $b_9$ of the sequential comparison register 7 according to the data latched in the latch circuit 6, while value "1" is automatically set to bit $b_8$. Thus the bit pattern of the sequential comparison register 7 becomes $(b_9, b_8, b_7, b_6, b_5, b_4, b_3, b_2, b_1, b_0)=(0, 1, 0, 0, 0, 0, 0, 0, 0, 0)$.

Because the switching signal TS turns to H level, the input analog voltage $A_{IN}$ is input to the comparator 4, to put the chopper amplifier in setup state. Further during a period $\phi_4$, the switching signal TS turns to L level and the switching signal #TS turns to H level so that the transmission gate 2 becomes non-conducting, then the transmission gate 3 conducts so that the reference voltage $V_{REF}$ selected according to the data stored in the sequential comparison register 7 and the input analog voltage $A_{IN}$ are compared.

In the case of $A_{IN} > V_{REF}$, output of the comparator 4 becomes "1" and is latched by the latch circuit 6 at the time $t_3$ according to the latch signal TL. This operation of comparison determines the bit $b_8$. Such operations are repeated to determine the bits $b_9$ through $b_0$ to complete the operation of analog to digital conversion of the 10-bit data.

When reading out the result of analog to digital conversion to the outside, a data bus not shown in the drawing is connected to the sequential comparison register 7 and the result of analog to digital conversion is read out. Timing signals such as the switching signals TS, #TS, the comparison control signal TZ and the latch signal TL are generated by the control circuit 108 (refer to FIG. 1).

In the analog/digital converter of the prior art, however, increasing the speed of analog to digital conversion decreases the length of period during which the chopper amplifier of the comparator is put in setup state, thereby making the point of operation of the chopper amplifier unstable, resulting in a problem of decreasing accuracy of analog/digital conversion. Also there is a problem that two analog voltages cannot be converted to digital data at a high speed.

SUMMARY OF THE INVENTION

The invention has been devised to solve the problems described above, and one of the objects of the invention is to provide an analog/digital converter which is capable of converting analog signals to digital signals at a high speed without decreasing the accuracy of the analog/digital conversion.

The analog/digital converter of the invention is provided with first and second comparators to compare input analog voltage with a reference voltage and a switching circuit which alternately outputs the analog voltage and the reference voltage and selectively supplies the outputs to the first or the second comparator, so that the first and the second comparators operate alternately to convert the analog voltage to a digital value.

Because the analog voltage or the reference voltage is fed to the second comparator to enter the setup state when the analog voltage and the reference voltage are fed successively to the first comparator to be compared therein, while the analog voltage or the reference voltage is supplied to the first comparator to enter the setup state when the second comparator is comparing the data, the operation of putting the comparator in setup state and the operation of comparison are carried out in parallel, thereby increasing the rate of supplying the outputs of the result of comparison.

Another object of the invention is to provide an analog/digital converter which is capable of converting analog signals to digital signals at a high speed without decreasing the accuracy of converting two analog voltages to digital values.

The analog/digital converter of the invention is provided with the first and the second comparators which compare analog voltage and reference voltage, first and second sequential comparison registers which respectively store the results of comparison supplied by the first and the second comparators and a selector circuit which selects the data stored in these sequential comparison registers, wherein the data stored in the first and the second sequential comparison registers are selected alternately to determine the reference voltage.

Consequently, because the second analog voltage or the reference voltage is supplied to the second comparator to enter the setup state when the first analog voltage and the reference voltage are supplied successively to the first comparator to be compared therein, while the reference voltage or the second analog voltage is supplied to the first comparator to enter the setup state when the second comparator is comparing the second analog voltage and the reference voltage, the operation of converting the first analog voltage to a digital value and the operation of converting the second analog voltage to a digital value are carried out in parallel, thereby increasing the speed of the analog/digital conversion. The reference voltages corresponding to the first and the second analog voltages are determined by alternately selecting the data stored in the first sequential comparison register and in the second sequential comparison register which store the results of comparison.

The above and further objects and features of the invention will more fully be apparent from the following detailed description with accompanying drawings.

BRIEF DESCRIPTION OF THE DRAWINGS

FIG. 12 is a timing chart of signals in the analog/digital converter of the invention.

DESCRIPTION OF THE PREFERRED EMBODIMENTS

The invention will now be described in detail with reference to the accompanying drawings illustrative of the preferred embodiments.

Figure 7:
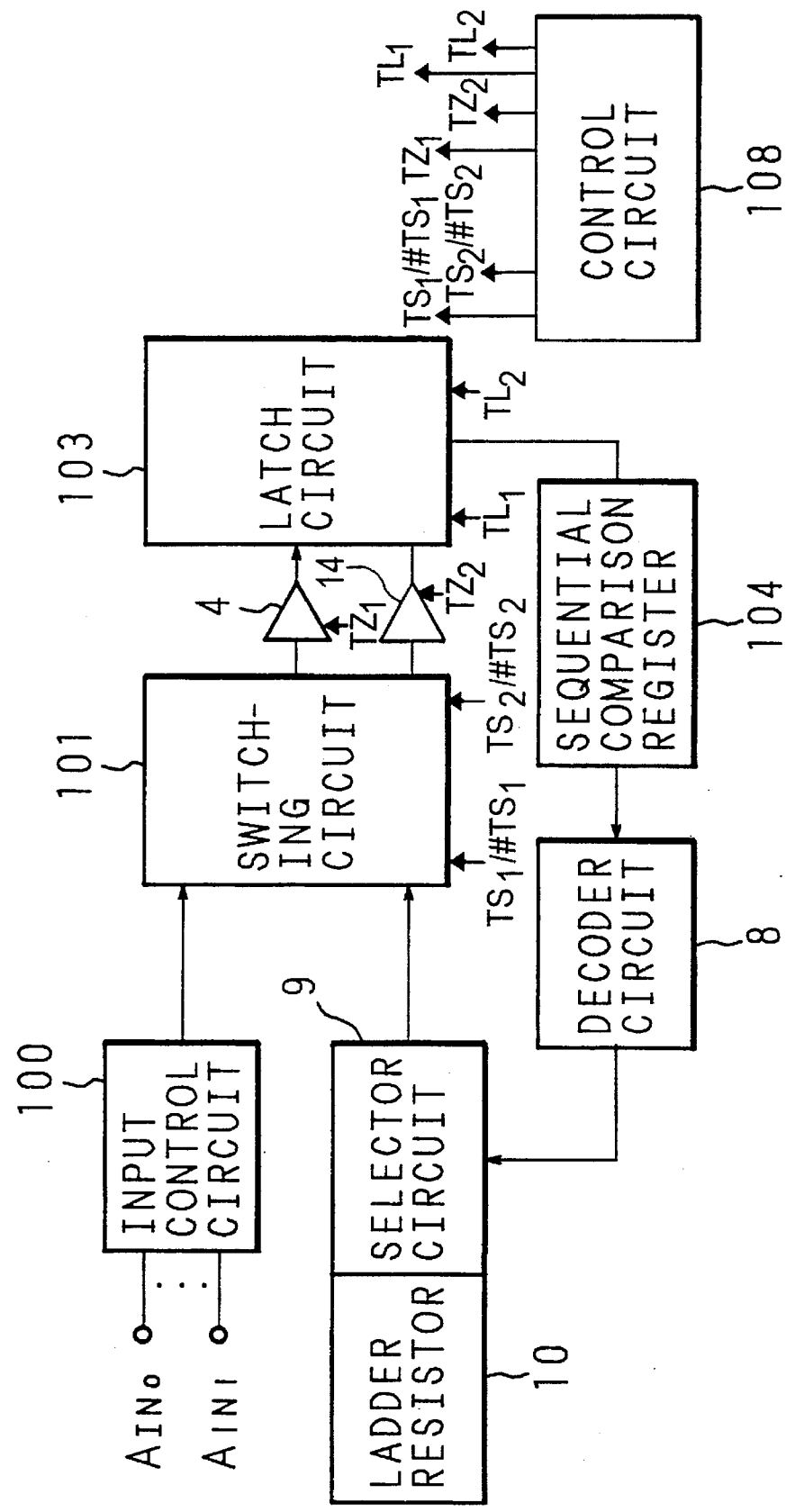
FIG. 7 is a schematic diagram illustrative of the constitution of the analog/digital converter of the invention.

FIG. 7 is a schematic diagram illustrative of the constitution of a analog/digital converter of the invention. Analog voltages $A_{IN0}$ through $A_{INi}$ to be converted to digital values are input to an input control circuit 100. Analog voltages output from the input control circuit 100 are input to a switching circuit 101.

A reference voltage output from the selector circuit 9 which selects the reference voltage generated by a ladder resistor 10 is input to the switching circuit 101. The analog voltage and the reference voltage which are output from the switching circuit 101 are input to a first comparator 4 and a second comparator 14, while comparison output signals from the comparators 4 and 14 are input to the latch circuit 103. Latched data of the latch circuit 103 is input to a register circuit 104, while data stored in the register circuit 104 is input to a decoder circuit 8. Decoded signal output from the decoder circuit 8 is sent to the selector circuit 9. The control circuit 108 is provided to generate timing signals for the control of various circuits.

Figure 8:
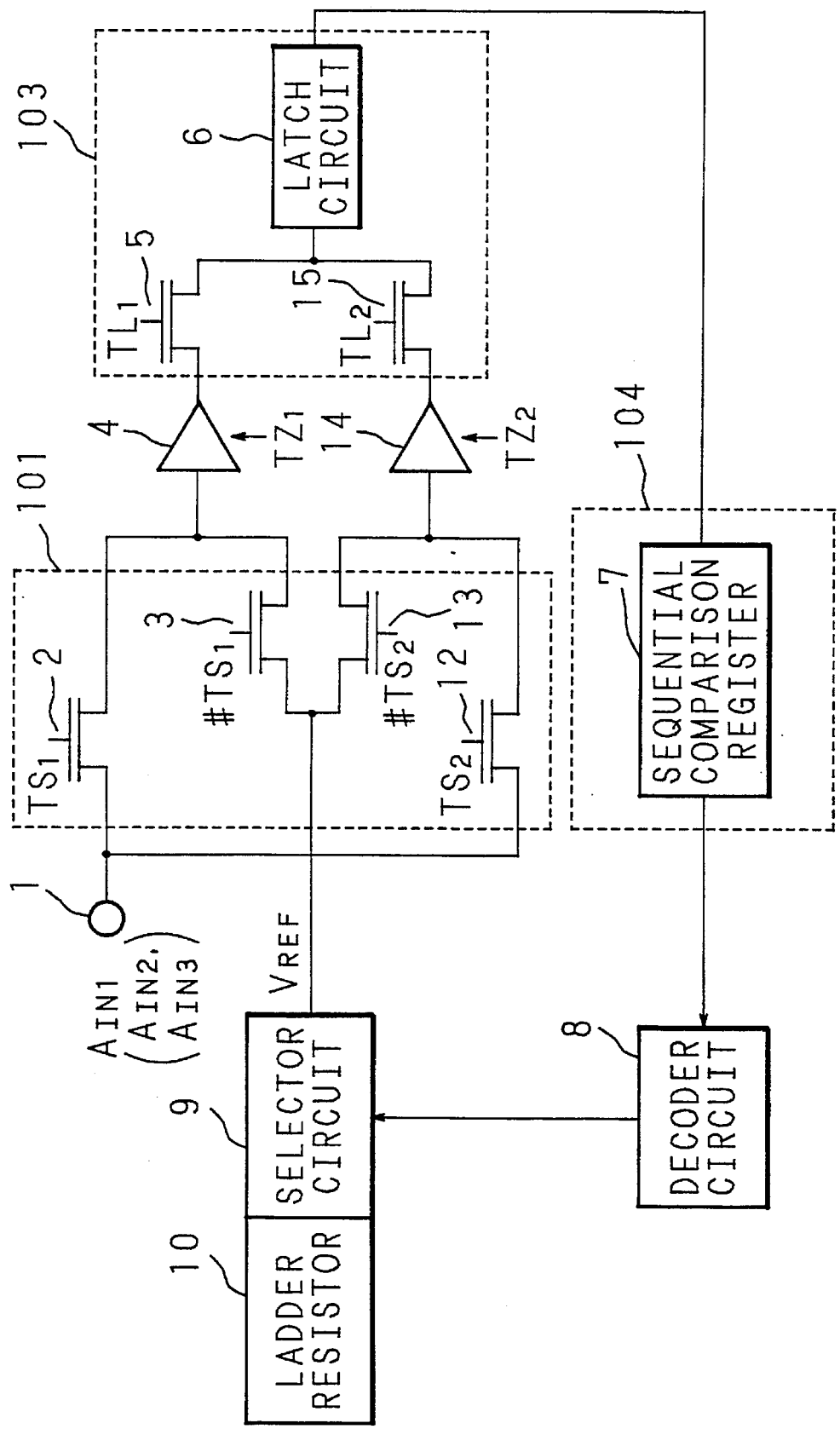
FIG. 8 is a block diagram illustrative of the constitution of the analog/digital converter shown in FIG. 7.

FIG. 8 is a block diagram illustrative of the constitution of the analog/digital converter shown in FIG. 7. The switching circuit 101 has transmission gates 2, 12, 3, 13. The input analog voltage $A_{IN}$ to the external analog input terminal 1 is input to the comparators 4, 14 via the transmission gates 2, 12. The reference voltage $V_{REF}$ output from the selector circuit 9 which selects the reference voltage generated by the ladder resistor 10 is input to the comparators 4, 14 via the transmission gates 3, 13.

The latch circuit 103 has transmission gates 5, 15 and a latch circuit 6. The comparison output signals from the comparators 4, 14 are input to the latch circuit 6 via the transmission gates 5, 15. The data latched by the latch circuit 6 is input to the sequential comparison register 7 while the data stored therein is input to the decoder circuit 8.

The sequential comparison register 7 constitutes the register circuit 104. The decoded signal output from the decoder circuit 8 is supplied to the selector circuit 9. The transmission gates 2, 12 receive the switching signals $TS_1$, $TS_2$ at the gates thereof, while the transmission gates 3, 13 receive the switching signals $\#TS_1$, $\#TS_2$ at the gates thereof. The transmission gates 5, 15 receive the latch signals $TL_1$, $TL_2$ at the gates thereof. The input control circuit 100 and the control circuit 108 shown in FIG. 7 are not shown here.

Figure 1:
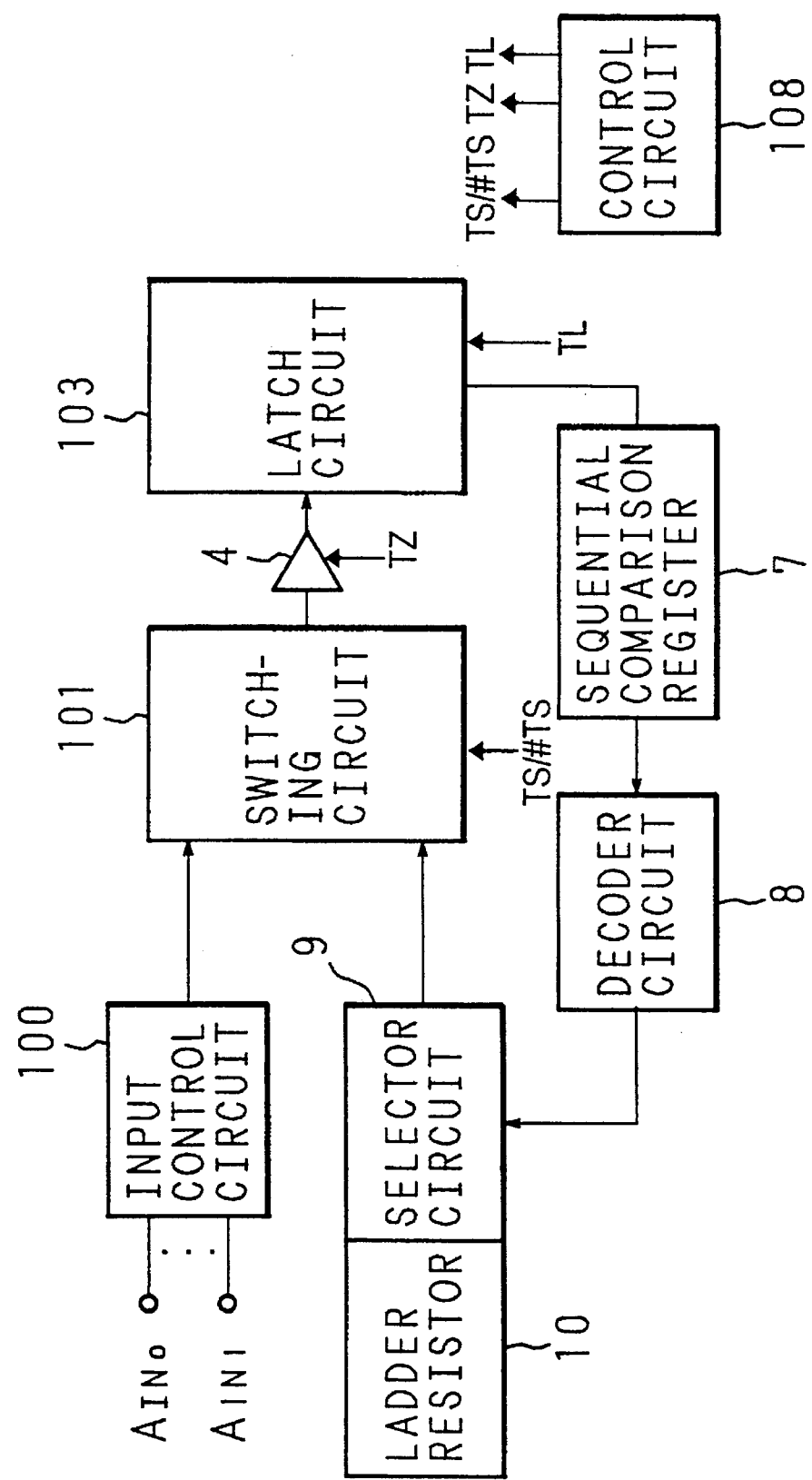
FIG. 1 is a schematic diagram illustrative of the constitution of a analog/digital converter of the prior art.
Figure 2:
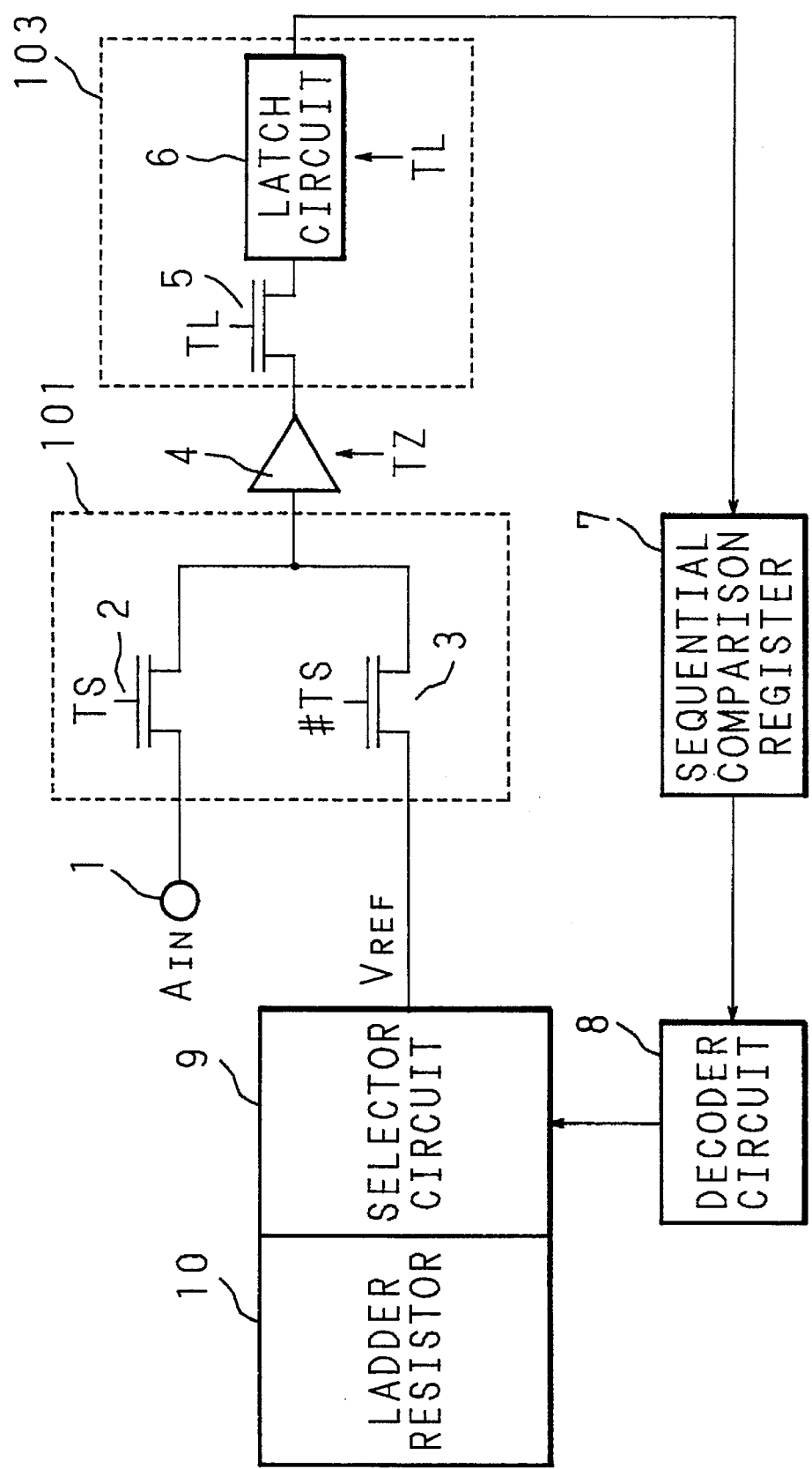
FIG. 2 is a block diagram illustrative of the constitution of a analog/digital converter shown in FIG. 1.
Figure 3:
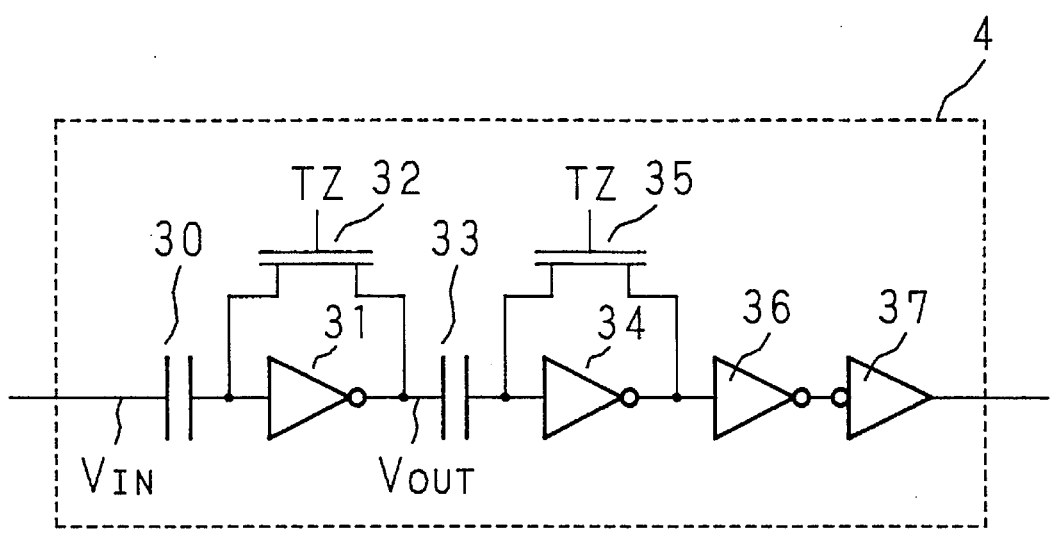
FIG. 3 is a block diagram illustrative of the constitution of a comparator commonly used.
Figure 4:
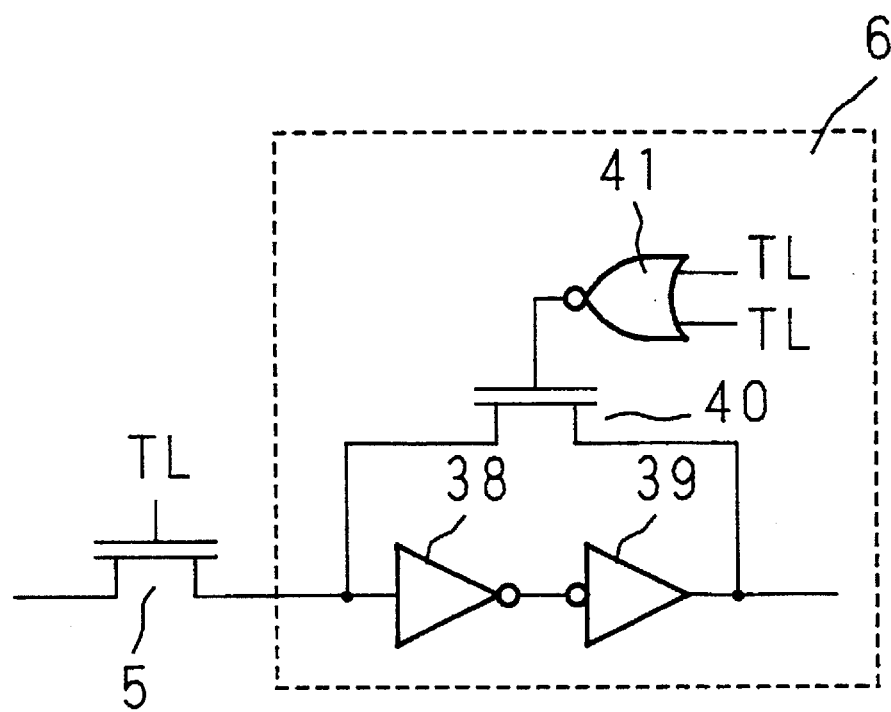
FIG. 4 is a block diagram illustrative of the constitution of a latch circuit commonly used.
Figure 5:
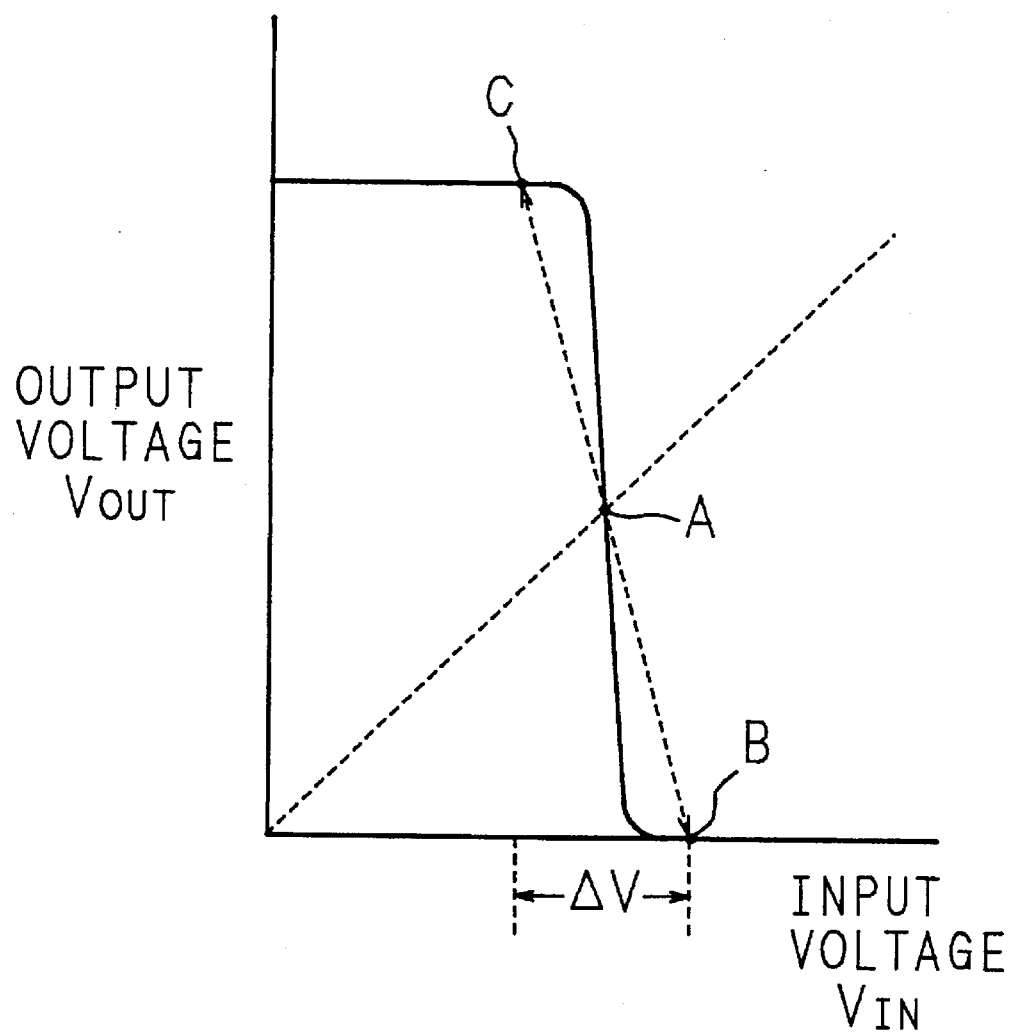
FIG. 5 is an input-output characteristic diagram of an inverter used in a chopper amplifier.
Figure 6:
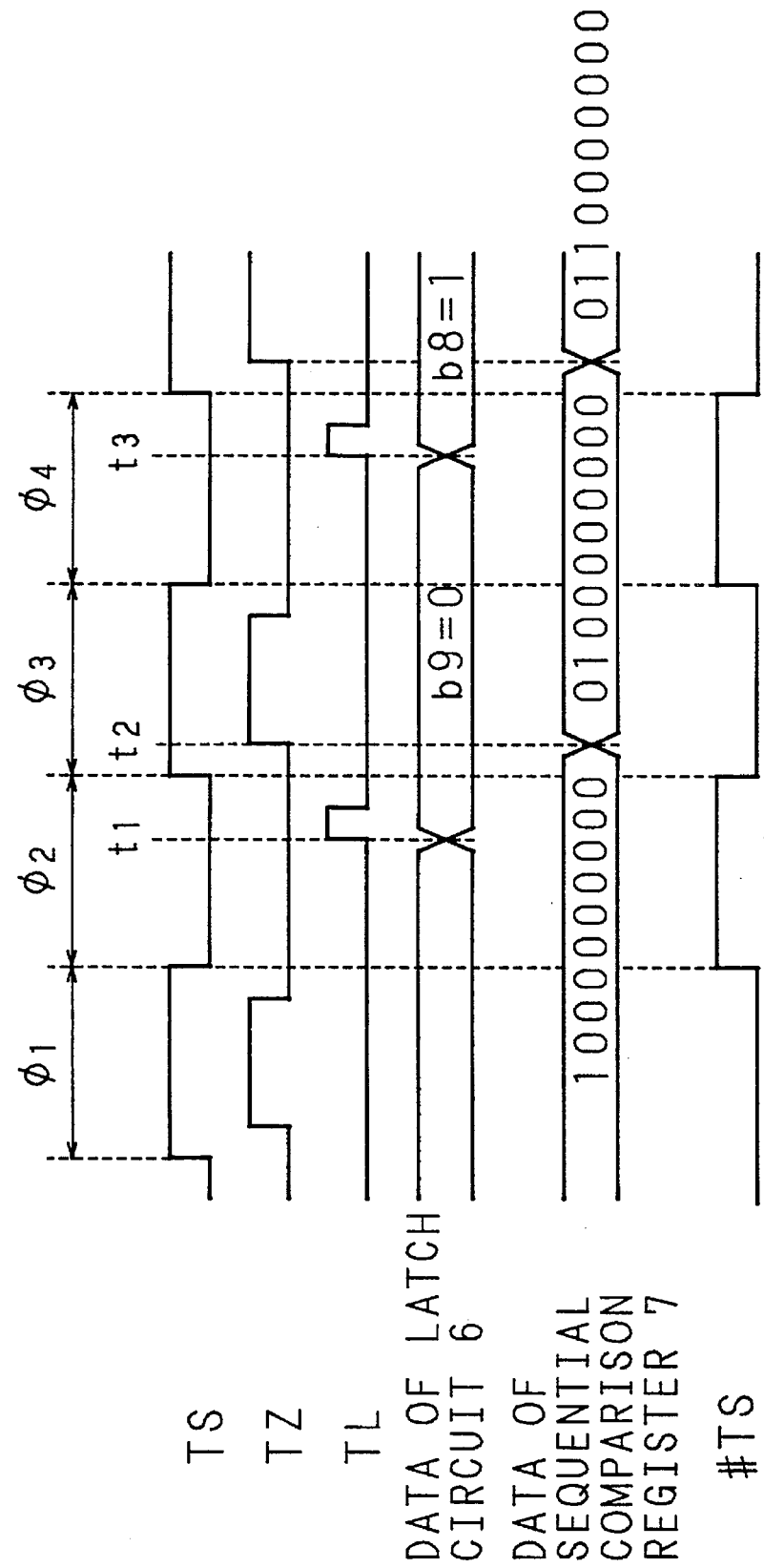
FIG. 6 is a timing chart of signals in the analog/digital converter of the prior art.

The comparator 4 is constituted similarly to the comparator shown in FIG. 3, while the latch circuit 6 is constituted similarly to the latch circuit shown in FIG. 4. Further the input-output characteristics of the inverters 31, 34 in the comparator 4 are similar to the input-output characteristics shown in FIG. 5.

Figure 9:
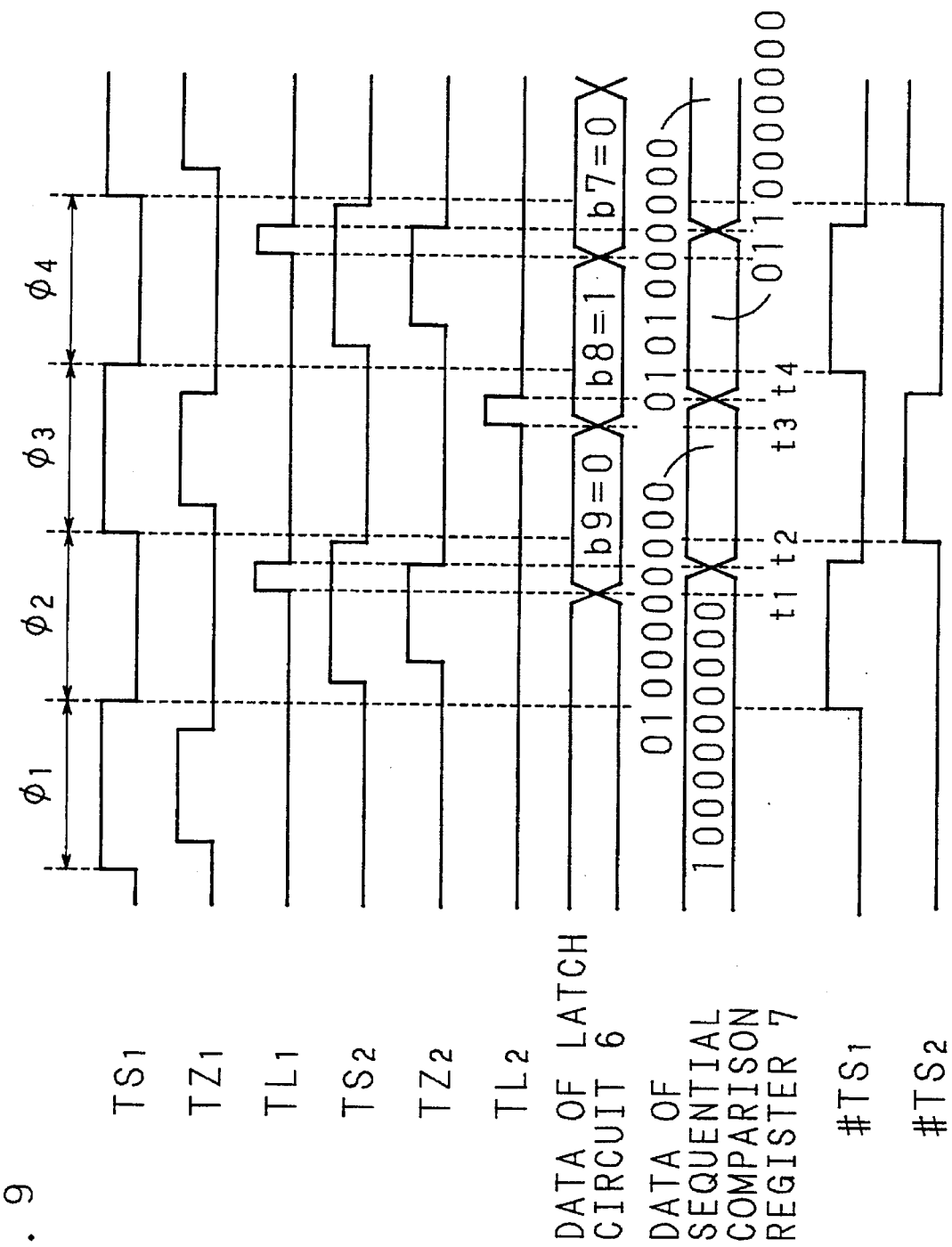
FIG. 9 is a timing chart of signals in the analog/digital converter of the invention.

Now the operation of the analog/digital converter will be described below with reference to FIG. 9 which shows the timing chart of the signals.

When the switching signal $TS_1$ turns to H level during the period $\phi_1$, the transmission gate 2 conducts so that the analog voltage $A_{IN1}$ applied to the external analog input terminal 1 is sent to the comparator 4.

When the comparison control signal $TZ_1$ turns to H level, a transmission gate 32 (refer to FIG. 3) of the comparator 4 conducts so that the comparator 4 is put in setup state. During the period $\phi_2$, the switching signal $TS_1$ turns to L level and the transmission gate 2 becomes non-conducting, while the switching signal $\#TS_1$ turns to H level so that the transmission gate is conducts. When the reference voltage $V_{REF}$ selected according to the data, stored in the sequential comparison register 7 is input to the comparator 4, the comparator 4 compares the magnitudes of the analog voltage $A_{IN1}$ and the reference voltage $V_{REF}$. Result of the comparison is latched by the latch circuit 6 at time $t_1$ when the latch signal $TL_1$ has risen, and the most significant bit $b_9$ of the sequential comparison register 7 is determined. "0" is set to bit $b_9$ when $A_{IN1}<V_{REF}$, and "1" is set to bit $b_9$ when $A_{IN1}>V_{REF}$ ($A_{IN1}<V_{REF}$ in this embodiment).

Then "1" is automatically set to bit $b_8$, thereby renewing the data stored in the sequential comparison register 7. Also because the switching signal $TS_2$ turns to H level during the period $\phi_2$, the transmission gate 12 conducts so that the analog voltage $A_{IN2}$ is input to the comparator 14. When the comparison control signal $TZ_2$ turns to H level, transmission gates 32, 35 (refer to FIG. 3) of the comparator 14 conduct thereby putting the comparator 14 in setup state.

When the switching signal $TS_1$ turns to H level during the period $\phi_3$, the transmission gate 2 conducts to input the analog voltage $A_{IN3}$ to the comparator 4, so that the comparator 4 enters setup state. As the switching signal $\#TS_2$ turns to H level and the transmission gate 13 conducts, the reference voltage $V_{REF}$ selected according to the data stored in the sequential comparison register 7 is input to the comparator 14, so that the comparator 14 compares the magnitudes of the reference voltage $V_{REF}$ and the analog voltage $A_{IN2}$. Result of the comparison is latched by the latch circuit 6 at a time $t_3$ when the latch signal $TL_2$ rises, so that bit $b_8$ of the sequential comparison register 7 is determined. "1" is set to bit $b_8$ when $A_{IN2}>V_{REF}$, and "0" is set to bit $b_8$ when $A_{IN2}<V_{REF}$ ($A_{IN2}>V_{REF}$ in this embodiment).

Then "1" is automatically set to bit $b_7$, thereby renewing the data stored in the sequential comparison register 7. Also the reference voltage $V_{REF}$ is renewed during the period $\phi_2$, and the switching signal $\#TS_1$ turns to H level during the period $\phi_4$ when the reference voltage $V_{REF}$ is selected according to the data stored in the sequential comparison register 7, so that the reference voltage $V_{REF}$ selected according to the data stored in the sequential comparison register 7 and the analog voltage $A_{IN3}$ are compared by the comparator 4. Result of comparison is latched by the latch circuit 6 at the time when the latch signal $TL_1$ rises, thereby to determine the bit $b_7$ of the sequential comparison register 7 ("0" is set to bit $b_7$ in this embodiment because $A_{IN3}<V_{REF}$). "1" is automatically set to bit $b_6$ thereby renewing the data stored in the sequential comparison register 7.

Also because the switching signal $TS_2$ turns to H level, the analog voltage $A_{IN4}$ is input to the comparator 14 and, when the comparison control signal $TZ_2$ turns to H level, the comparator 14 is put in setup state.

The operation described above is repeated thereby to determine the values of $b_9$, $b_7$, $b_5$, $b_3$, $b_1$ by the comparator 4 and the values of bits $b_8$, $b_6$, $b_4$, $b_2$, $b_0$ by the comparator 14 alternately. While the analog/digital converter of the prior art takes a period of 20x $\phi$ cycles to carry out the analog/digital conversion of 10-bit data at an overlapping timing, the analog/digital converter of the invention is capable of carrying out the analog/digital conversion in a period of 11x $\phi$ cycles, thereby increasing the speed of the analog/digital converting operation. Also because the pulse duration of the comparison control signal TZ which determines the time of putting the chopper amplifier in setup state is the same as in the case of the analog/digital converter of the prior art, a high accuracy of analog/digital conversion can be maintained.

Figure 10:
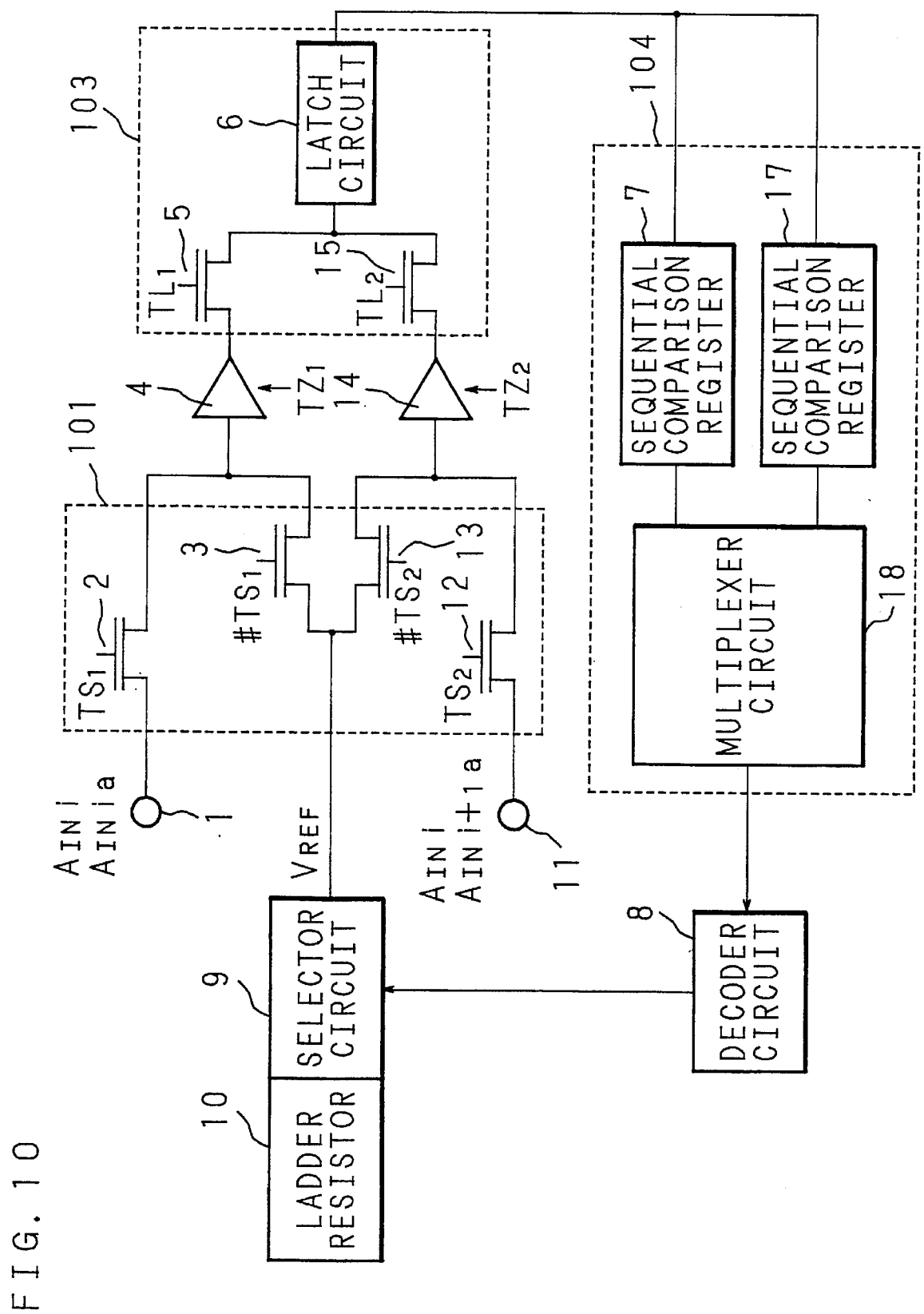
FIG. 10 is a block diagram illustrative of the constitution of another embodiment of the analog/digital converter of the invention.

FIG. 10 is a block diagram illustrative of the constitution of another embodiment of the analog/digital converter shown in FIG. 7.

The switching circuit 101 has transmission gates 2, 12, 3, 13. Analog voltages $A_{Ni}$ and $A_{INi+1}$ which are input to the external analog input terminals 1, 11 are input to the comparators 4, 14 via the transmission gates 2, 12. The reference voltage $V_{REF}$ output from the selector circuit 9 which selects the reference voltage generated by the ladder resistor 10 is input to the comparators 4, 14 via the transmission gates 3, 13.

The latch section 103 has transmission gates 5, 15 and the latch circuit 6, and the register circuit 104 has the sequential comparison registers 7, 17 and the multiplexer circuit 18. Comparison output signal from the comparators 4, 14 are input to the latch circuit 6 via the transmission gates 5, 15. Data latched in the latch circuit 6 is input to the sequential comparison register 7 and the sequential comparison register 17. Data stored in the sequential comparison registers 7, 17 is input to the multiplexer circuit 18.

Data stored in the sequential comparison registers 7, 17 and is selected by the multiplexer circuit 18 is input to the decoder circuit 8 which outputs decoded signal to the selector circuit 9. The transmission gates 2, 12 receive switching signals $TS_1$, $TS_2$ at the gates thereof, and the transmission gates 3, 13 receive switching signals $\#TS_1$, $\#TS_2$ at the gates thereof. The transmission gates 5, 15 receive latch signals $TL_1$, $TL_2$ at the gates thereof.

The input control circuit 100 and the control circuit 108 are not shown in the drawing. The comparators 4, 14 are constituted similarly to the comparator 4 shown in FIG. 3, and the latch circuit 6 is constituted similarly to the latch circuit 6 shown in FIG. 4. Further the inverters provided in the comparators 4, 14 have input-output characteristic similar to that shown in FIG. 5.

Figure 11:
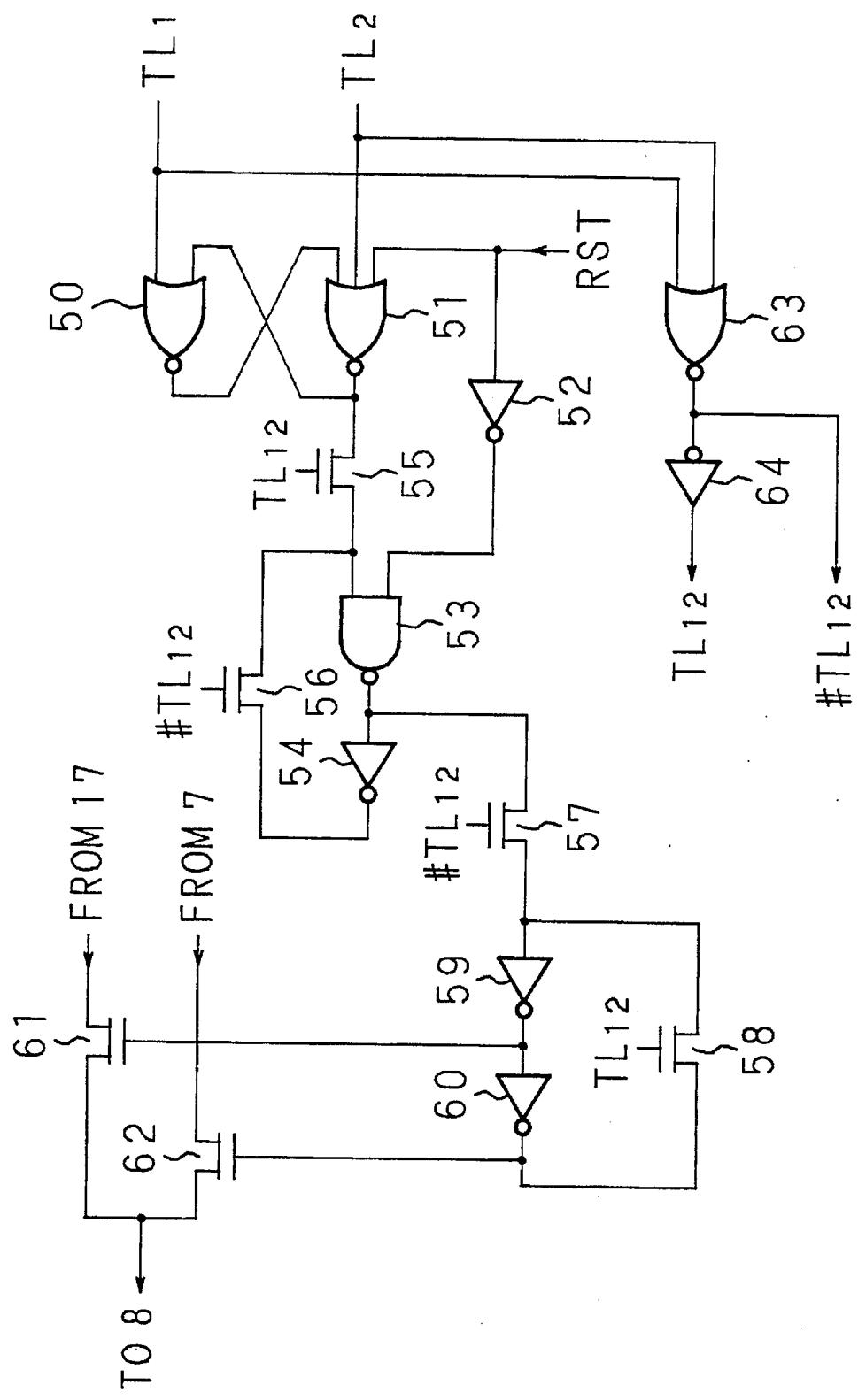
FIG. 11 is a block diagram illustrative of the constitution of a multiplexer circuit of the invention.

FIG. 11 is a block diagram illustrative of the constitution of the multiplexer circuit 18. Data stored in the sequential comparison registers 17, 7 are sent to the decoder circuit 8 via transmission gates 61, 62. Latch signal $TL_1$ is input to input terminals one side of a NOR circuit 50 and of a NOR circuit 63, while the output terminal of the NOR circuit 50 is connected to first input terminal of a 3-input NOR circuit 51. Second input terminal of the 3-input NOR circuit 51 and another input terminal of the NOR circuit 63 receive the latch signal $TL_2$, while third input terminal of the NOR circuit 51 receives a reset signal RST which is held at H level for a specified period at the time of initialization. A latch signal $\#TL_{12}$ is output at an output terminal of the NOR circuit 63, and is input to the gates of transmission gates 56, 57 to be described later. The latch signal $\#TL_{12}$ is also input to the inverter 64. The latch signal $TL_{12}$ output from the inverter 64 is input to the gates of transmission gates 55, 58 to be described later.

Output terminal of the 3-input NOR circuit 51 is connected to another input terminal of the NOR circuit 50, and is connected to the input terminal one side of a NAND circuit 53 via the transmission gate 55. The reset signal RST is input to the inverter 52 while the output terminal of the inverter 52 is connected to another input terminal of the NAND circuit 53. Output terminal of the NAND circuit 53 is connected to the input terminal one side of the NAND circuit 53 via the serial circuit of the inverter 54 and the transmission gate 56.

Junction of the output terminal of the NAND circuit 53 and the inverter 54 is connected to the input side of the inverter 59 via the transmission gate 57. Output side of the inverter 59 is connected to the input side of the inverter 60, and output side of the inverter 60 is connected to the junction of the inverter 59 and the transmission gate 57 via the transmission gate 58. Junction of the inverters 59 and 60 is connected to the gate of the transmission gate 61, while the junction of the output side of the inverter 60 and the transmission gate 58 is connected to the gate of the transmission gate 62.

The multiplexer circuit 18 operates in such a manner as; when the latch signal $TL_1$ turns to H level after the reset signal RST turns to L level, output of the NOR circuit 50 turns to L level, output of the 3-input NOR circuit 51 turns to H level, output of the NOR circuit 63 turns to L level, and the latch signal $TL_{12}$ turns to H level. Because the latch signal $TL_{12}$ is at H level, the transmission gate 55 conducts while the NAND circuit 53 receives H-level output of the 3-input NOR circuit 51 and H-level output of the inverter 52, so that the NAND circuit 53 gives an output at L level.

When the latch signal $TL_1$ turns to L level, the latch signal $\#TL_{12}$ is inverted to H level to make the transmission gate 57 conduct while the output of the inverter 59 turns to H level to make the transmission gate 61 conduct, so that the multiplexer circuit 18 selects the data stored in the sequential comparison register 17.

When the latch signal $TL_2$ turns to H level, on the other hand, output of the 3-input NOR circuit 51 turns to L level so that output of the NOR circuit 63, namely the latch signal $\#TL_{12}$ turns to L level and the latch signal $TL_{12}$ turns to H level.

Because the latch signal $TL_{12}$ is at H level, the transmission gate 55 conducts while the NAND circuit 53 receives L-level output of the 3-input NOR circuit 51 and the H-level output of the inverter 52 as inputs, so that the NAND circuit 53 gives a H-level output. When the latch signal $TL_2$ is inverted to L level, the latch signal $\#TL_{12}$ is inverted to H level to make the transmission gate 57 conduct and output of the inverter 59 turns to L level, thereby turning the output of the inverter 60 to H level and the transmission gate 62 conducts, so that the multiplexer circuit 18 selects the data stored in the sequential comparison register 7. Specifically, data stored in the sequential comparison registers 17, 7 are selected at the time when the latch signals $TL_1$, $TL_2$ fall.

Now the operation of the analog/digital converter constituted as described above will be described below with reference to FIG. 12 which shows the timing chart of the signals.

When the switching signal $TS_1$ turns to H level during the period $\phi_1$, the transmission gate 2 conducts so that the analog voltage $A_{INi}$ applied to the external analog input terminal 1 is sent to the comparator 4. When the comparison control signal $TZ_1$ turns to H level, the chopper amplifier of the comparator 4 is put in setup state.

During the period $\phi_2$, when the switching signal $\#TS_1$ turns to H level, the transmission gate 3 conducts, while the reference voltage $V_{REF}$ selected according to the data stored in the sequential comparison register 7 is input to the comparator 4, so that the comparator 4 compares the magnitudes of the analog voltage $A_{INi}$ and the reference voltage $V_{REF}$. Result of the comparison is latched by the latch circuit 6 at the time when the latch signal $TL_1$ rises, and the most significant bit $b_9$ of the sequential comparison register 7 is determined. ("0" is set to bit $b_9$ because $A_{INi} < V_{REF}$ in this embodiment.)

Because the switching signal $TS_2$ turns to H level during the period $\phi_2$, the transmission gate 12 conducts so that the analog voltage $A_{INi+1}$ applied to the external analog input terminal 11 is input to the comparator 14. When the comparison control signal $TZ_2$ turns to H level, the transmission gates 32, 35 (refer to FIG. 3) conduct thereby putting the chopper amplifier of the comparator 14 in setup state.

When the switching signal $\#TS_2$ turns to H level during the period $\phi_3$, the transmission gate 13 conducts to input the reference voltage $V_{REF}$ selected according to the data stored in the sequential comparison register 17 to the comparator 14, so that the comparator 14 compares the magnitudes of the reference voltage $V_{REF}$ and the analog voltage $A_{INi+1}$. Result of the comparison is latched by the latch circuit 6 at the time when the latch signal $TL_2$ rises, thereby to determine the most significant bit $B_9$ of the sequential comparison register 17 ("1" is set to bit $B_9$ because $A_{INi+1} > V_{REF}$ in this embodiment).

Further, the multiplexer circuit 18 makes the switching operation at the fall of the latch signal $TL_2$ as described above to select the data stored in the sequential comparison register 7 and outputs the data to the decoder circuit 8. Then the switching signal #$TS_1$ turns to H level during the period $\phi_4$, and the magnitudes of the reference voltage $V_{REF}$ selected according to the data stored in the sequential comparison register 7 and the analog voltage $A_{INia}$ are compared. Result of the comparison is latched by the latch circuit 6 at the time when the latch signal $TL_1$ rises, thereby to determine the bit $b_8$ of the sequential comparison register 7 ("1" is set to bit $b_8$ because $A_{INia} > V_{REF}$ in this embodiment).

The multiplexer circuit 18 further makes switching operation at the fall of the latch signal $TL_1$, selects the data stored in the sequential comparison register 7 and outputs the data to the decoder circuit 8. Also because the switching signal $TS_2$ turns to H level during the period $\phi_4$, the transmission gate 12 conducts and the analog voltage $A_{INI+1a}$ is input to the comparator 14, so that the comparator 14 is put in setup state.

The operation described above is repeated thereby to determine the values of $b_9$, $b_8$, $b_7$, . . . by the comparator 4 and the values of bits B9, $B_8$, $B_7$, . . . by the comparator 14 alternately. While the analog/digital converter of the prior art, takes a period of 40x $\phi$ cycles to carry out the analog/digital conversion of two analog voltages each to 10-bit digital data at an overlapping timing, the analog/digital converter of the invention is capable of carrying out the analog/digital conversion of two analog voltages in a period of 22x $\phi$ cycles at a high speed.

Also because the pulse duration of the comparison control signal TZ which determines the time of putting the chopper amplifier in setup state is the same as in the case of the analog/digital converter of the prior art, a high accuracy of analog/digital conversion can be maintained.

As described in detail above, the invention provides an analog/digital converter which has the first and the second comparators to compare the analog voltage and the reference voltage wherein the comparators make comparison operation alternately thereby to convert the analog voltage to a digital value, and is therefore capable of converting analog voltages to digital values at a high speed while maintaining a high accuracy of conversion.

Also because the analog/digital converter of the invention has the first and the second comparators to compare the analog voltage and the reference voltage, the first sequential comparison register and the second sequential comparison register to store the result of comparison by the first and the second comparators, respectively, and a selector circuit to select the data stored in the first and the second sequential comparison registers, wherein data held by the first and the second sequential comparison registers are selected alternately to convert analog voltages to digital values, and therefore it has excellent effects such as the capability of converting two analog voltages with a high accuracy at a high speed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An analog/digital converter which compares an analog voltage with a reference voltage and converts said analog voltage to a digital value, comprising:

a first comparator and a second comparator which receive said analog voltage and said reference voltage and respectively compare the values thereof, said first and second comparators operating alternately, each providing a comparison output signal as a result of said comparison;

a switching circuit which outputs alternately said analog voltage and said reference voltage and selectively supplies a pair of outputs to said first and second comparators;

a gated latch circuit connected to said first and second comparators, for alternately latching the comparison output signals of said first and second comparators, respectively;

a sequential comparison register which receives the latched comparison output signals and sequentially stores digital values on the basis thereof; and a reference voltage generator circuit which generates said reference voltage of a value determined according to said digital values stored in said sequential comparison register.

2. An analog/digital converter which compares two analog voltages with a reference voltage and converts said analog voltages to digital values, comprising:

a first comparator and a second comparator which receive said analog voltages and said reference voltage and respectively compare the values thereof, said first and second comparators operating alternately, each providing a comparison output signal as a result of said comparison;

a switching circuit which successively outputs said two analog voltages and said reference voltage, and alternately supplies one of said analog voltages and said reference voltage to said first comparator and another of said analog voltages and said reference to said second comparator;

a first sequential comparison register and a second sequential comparison register which respectively receive results of comparisons by said first and second comparators, and store two digital values on the basis of said results;

a multiplexer circuit which selects either of said results received in said first and second sequential comparison registers; and a reference voltage generator circuit which generates said reference voltage of a value determined on the basis of the result selected by said multiplexer circuit.

3. The analog/digital converter of claim 1, wherein said gated latch circuit comprises:

a latch circuit; and a first transmission gate connected between an output of said first comparator and the latch circuit and a second transmission gate connected between an output of said second comparator and the latch circuit; wherein said first and second transmission gates are operated alternately.

4. The analog/digital converter of claim 2, further comprising:
a gated latch circuit connected between said first and second comparators and said sequential comparison registers, for alternately latching the comparison output signals of said first and second comparators, and for supplying the latched comparison output signals to said sequential comparison registers.

* * * * *